Feb. 3, 1970 L. NOLL ET AL 3,493,705

PUSHBUTTON SWITCH

Filed Nov. 7, 1967 3 Sheets-Sheet 1

Inventors
Ludwig Noll
Leopold Gindle &
Carl Franz Gruber

BY [signature]
ATTORNEY

Inventors
Ludwig Noll
Leopold Gindle &
Carl Franz Gruber
BY Oler John Munz
ATTORNEY Feb. 3, 1970 L. NOLL ET AL 3,493,705

PUSHBUTTON SWITCH

Filed Nov. 7, 1967 3 Sheets-Sheet 3

Inventors
Ludwig Noll
Leopold Gindle &
Carl Franz Gruber

BY Otto John Munz.
ATTORNEY

United States Patent Office 3,493,705

Patented Feb. 3, 1970

3,493,705

PUSHBUTTON SWITCH

Ludwig Noll, Neu-Isenburg, Leopold Gindle, Langen, Hesse, and Carl F. Gruber, Frankfurt am Main-Griesheim, Germany, assignors to Schoeller & Co. Elektrotechnische Fabrik Filed Nov. 7, 1967, Ser. No. 681,187
Claims priority, application Germany, Dec. 14, 1966, Sch 39,961
Int. Cl. H01h 3/12
U.S. Cl. 200—159 8 Claims

ABSTRACT OF THE DISCLOSURE

A pushbutton switch assembly more especially for wave band switches for transistor sets and television sets comprising a U-shaped mounting, a plurality of similar recesses in a first leg of said mounting to receive the pushbutton sliders of said switches, and a plurality of similar recesses in a second leg of said mounting extending into the base of the U of said mounting, the recesses in said second leg being shaped to receive clamping members for the contact carriers of wave band switches and the coupling members of main switches.

The invention relates to a pushbutton switch assembly, more especially a wave band and/or mains switch assembly for transistor sets, television sets and the like employing a U-shaped mounting in which recesses are formed to receive the individual switches.

In radio or television sets switches of various types may be used, for example, wave band switches, mains switches, volume switches and the like. The object of the present invention is to accommodate these various types of switches on a common mounting any switch being capable of location at any required position on the mounting, and thus provide any desired switch combination or assembly.

It is thus proposed in accordance with the invention to provide a plurality of like recesses in one face of a U-shaped mounting with further recesses in the other face extending right into the base of the U and serving to receive clamping members of the switch contact carriers or coupling members of mains switches.

An arrangement in accordance with the invention has the advantage of producing a substantial simplification and reduction of costs in storing mountings and their associated switch components. The mountings may be cut to any reqiured length and the various types of switches assembled at appropriate points on the mounting. Moreover, the switch components are of simple construction and may be replaced without trouble, and manufacturing and assembly costs are low. The construction employed is also space-saving.

According to a feature of the invention, the clamping members for the contact carriers and the coupling members for the mains switches are provided with grooves for insertion in the recesses of the mounting. In predetermining the switch positions and switching paths it is preferred to insert interchangeable gate members together with the terminals or coupling members between the legs of the U-mounting. The gate members may be provided with different switch positions and switch paths varying in length as required. A clip-like retaining spring is provided, with a stabilising eyelet and a hook for engagement in the gate the spring engaging also with a slot in the button-carrying slide. Extensions and bendable flaps may be provided on the coupling member on the mains switch housing for securing the mains switch. The coupling member may have guide grooves for the extension, provided with supporting edges. The button slider for the mains switch may be provided with a coupling pin which engages in an angled recess of the slider mounted in the mains switch housing. The manufacture of the slider for the wave band switch, the contact carriers of which are retained on the mounting by means of clamping members, is preferably provided with "printed" contact surfaces.

The accompanying drawings illustrate embodiments in accordance with the invention, and the figures are as follows.

Figure 1:
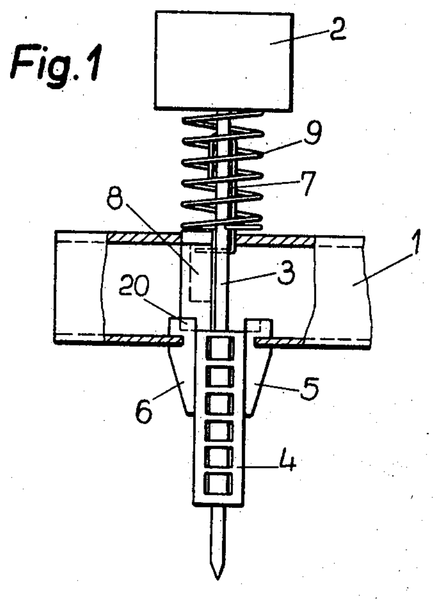
FIG. 1 is a plan view of a section of the chassis ledge with wave band switch inserted.
Figure 2:
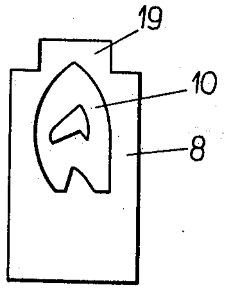
FIG. 2 is a plan view of a gate member.
Figure 3:
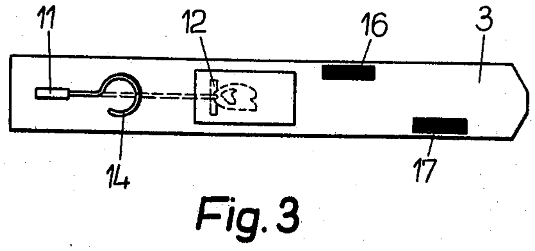
FIG. 3 is a plan view of a button slider.
Figure 4:
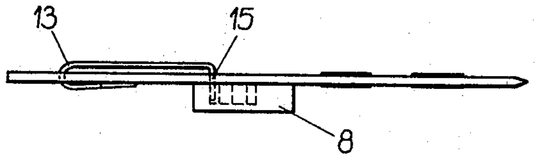
FIG. 4 is a side view of the button slider according to FIG. 3.
Figure 5:
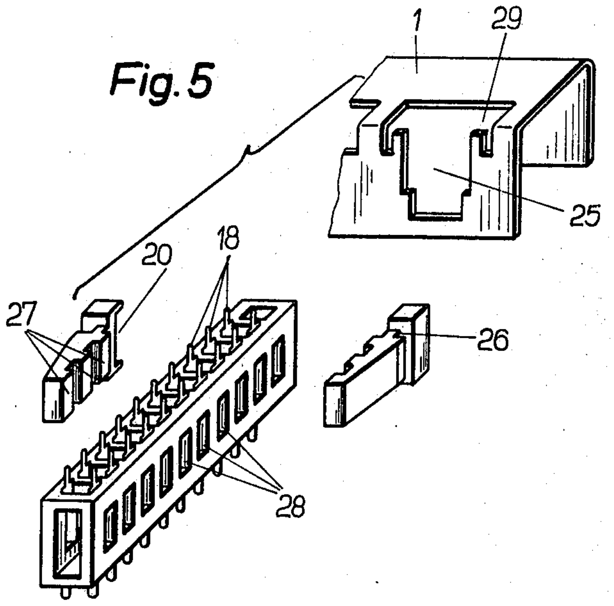
FIG. 5 is a persepective view of a part of the mounting and contact terminal strip with the two clamping members.

The waveband switch shown in FIGS. 1 to 5 has a U-shaped mounting 1 and comprises a pushbutton 2, a pushbutton slider 3, a contact carrier 4, two clamping members 5 and 6, a spring 7, a gate member 8 and a return spring 9. A gate 10 is machined in the gate member 8 the gate determining the switching positions and the length of the switching path. The spring 7 is inserted in slots 11 and 12 of the pushbutton slider 3 and has a securing end 13 with stabilising eyelet 14, and a hook-shaped bend 15 which projects into the gate 10. The slider 3 has printed contact surfaces 16 and 17 which co-operate with contacts 18 of the contact carrier 4. The gate member 8 arranged within the mounting 1, has an extension 19 which slides in a slot in the chassis ledge 10, whilst the opposite end of the insert member 8 projects into depressions 20 of the clamping members 5 and 6. The pushbutton slider 3, after being pushed into the contact carrier 4, is supported against the gate member 8, so that it is prevented from dropping out of its holder.

The rear face of the mounting 1 has a plurality of similar recesses 25 (FIG. 5) formed therein in which the clamping members 5 and 6 are inserted by means of their grooves 26, together with the contact carriers 4. The serrations 27 of the clamping members 5 and 6 engage in the recesses 28 of the contact carrier 4, so that they are prevented from slipping out of the clamping members. The recesses 29 in the front face of the mounting 1 are also of identical construction.

Figure 6:
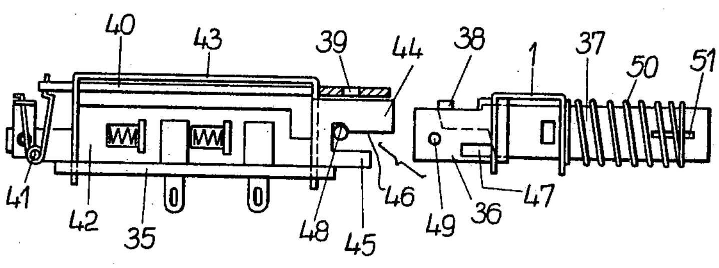
FIG. 6 is a side view of the mounting with installed pushbutton slider and coupling member, and a side view of the main switch.
Figure 7:
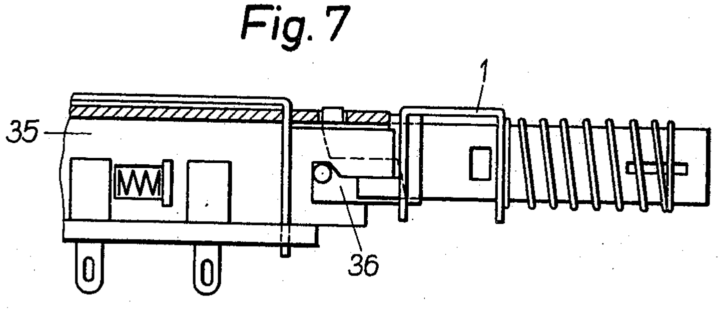
FIG. 7 shows a main switch mounted on the mounting.
Figure 8:
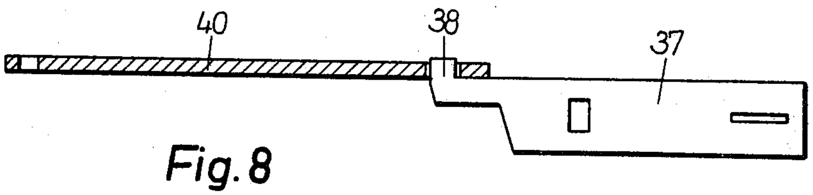
FIG. 8 is a side view of the auxiliary slider and the pushbutton slider for the mains switch.

As shown in FIGURES 6 and 7 the wave band switch may be replaced by mains switches 35 in the mounting 1. For this purpose the clamping members 5 and 6 are replaced by coupling members 36 which are inserted in the recesses 25. A pushbutton slider 37 for the mains switches 35 projects through the mounting 1 and at its inner end is provided with a projection 38 which, as shown in FIG. 7, engages in a recess 39 of an auxiliary slider 40. Hairpin springs 41 which form a snap switching mechanism for the contact slider 42, are mounted on an auxiliary slider 40. Junction extensions 44 and flaps 45 are provided on the mains switch housing 43. The extensions 44 have supporting edges 46 for shoulders 47 on the coupling member 36 and angled slots 48 for coupling pins 49 on the coupling member 36. The flaps 45 are bent over after connection of the mains switch 35 with the coupling member 36 so that the mains switch is rigidly mounted on the coupling member and is prevented from slipping off. Since all recesses on the leading and rear faces of the mounting 1 are identical in shape, the mains switch 35 may be mounted by means of the coupling member 36 at any required point on the mounting. A return spring 50 with an abutment 51 is located on the pushbutton slider 37.

With the aid of the clamping members 5 and 6 and the coupling members 36 it is thus possible, using only one mounting, to assemble all necessary switch combinations. All circuit requirements occurring in radio and television technology may thus be satisfied using only a few cheap components. This substantially simplifies storage, and assembly costs are considerably reduced.

We claim:

1. A pushbutton switch assembly more especially for wave band switches for transistor and television sets, comprising a U-shaped mounting for a plurality of switches, a plurality of similar recesses defined in the first leg of said mounting to receive the pushbutton sliders of said switches, a plurality of similar recesses defined in the second leg of said mounting extending into the base of the U of said mounting, the recesses in said second leg being shaped to receive clamping members for the contact carriers of wave band switches and the coupling members of main switches, gate members interchangeably insertable at the switch positions between the legs of said mounting, a spring provided for each gate, and a stabilising eyelet and a hook engaging in each said gate, one end of said spring being held in a slot defined by said pushbutton slider.

2. A pushbutton switch assembly as recited in claim 1, characterised by the feature that said contact carriers of wage band switches and said coupling members for the mains switches have grooves shaped to engage with the edges of said recesses.

3 A pushbutton switch assembly as recited in claim 1 characterised by further recesses formed in one leg of said mounting for inserting said gate members.

4. A pushbutton switch assembly as recited in claim 1 characterised by the feature that said gate members are pierced with gates shaped to provide different switch positions, and switching paths varying in length.

5. A pushbutton switch assembly as recited in claim 1, comprising suspending flanges and bendable flaps on each mains switch housing for securing said mains switch to a coupling member.

6. A pushbutton switch assembly as recited in claim 1 characterised by the feature that said coupling member has guide cams for the suspending flanges said guide cams having supporting edges.

7. A pushbutton switch assembly as recited in claim 1 characterised by the feature that said pushbutton slider of said mains switch has a coupling projection which engages in a recess on said auxiliary slider said slider being mounted in said mains switch housing.

8. A pushbutton switch assembly as recited in claim 1 characterised by the feature that each wave band switch has printed contact surfaces and contact carriers retained by clamping members on said mounting.

References Cited

UNITED STATES PATENTS

| | | | |
|---|---|---|---|
| 2,471,568 | 5/1949 | Harrison ------- | 200—159 XR |
| 3,248,491 | 4/1966 | Kroll et al. ------ | 200—159 XR |

ROBERT K. SCHAEFER, Primary Examiner

ROBERT A. VANDERHYE, Assistant Examiner